United States Patent

Yokoyama

Patent Number: 5,783,959
Date of Patent: Jul. 21, 1998

[54] HIGH PRECISION CLOCK SIGNAL GENERATOR

[75] Inventor: Yoshio Yokoyama, Kumagaya, Japan

[73] Assignee: Advantest Corp., Tokyo, Japan

[21] Appl. No.: 667,412

[22] Filed: Jun. 21, 1996

[30] Foreign Application Priority Data

Jun. 22, 1995 [JP] Japan .................... 7-179460

[51] Int. Cl.$^6$ .............................. H04L 7/06; H03K 5/13
[52] U.S. Cl. ................ 327/292; 327/291; 327/294; 327/156
[58] Field of Search .................... 327/164, 165, 327/166, 291, 292, 147, 156, 107, 34, 552, 293, 294, 551

[56] References Cited

U.S. PATENT DOCUMENTS 5,036,230  7/1991  Bazes ........................ 327/292

*Primary Examiner*—Timothy P. Callahan
*Assistant Examiner*—Dinh Le
*Attorney, Agent, or Firm*—Muramatsu & Associates

[57] ABSTRACT

A clock signal generator for an IC tester has a clock control circuit provided between a jitter reduction circuit and an IC device to be tested. The clock control circuit inhibit the clock signal from reaching the IC device for a time period required for a clock signal changes to a new frequency. The clock signal generator includes: a timing generator for generating clock signals and timing signals based on a test program, a pattern generator which receives the timing signals from the timing generator for producing test pattern signals to be supplied to the IC device based on the test program, a jitter reduction circuit for receiving a clock signal from the timing generator and for reducing a jitter of the clock signal, and a clock control circuit for inhibiting the clock signal from the jitter reduction circuit from being supplied to the IC device for a inhibit period determined by the test program when a frequency of the clock signal has been changed.

7 Claims, 6 Drawing Sheets

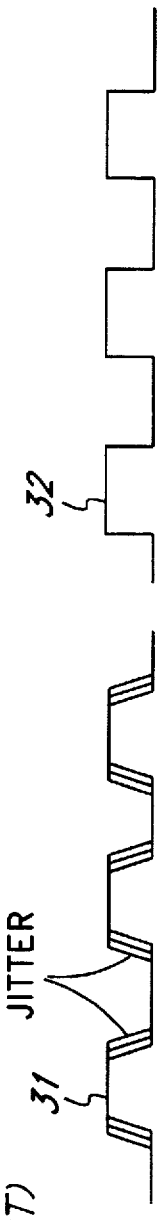
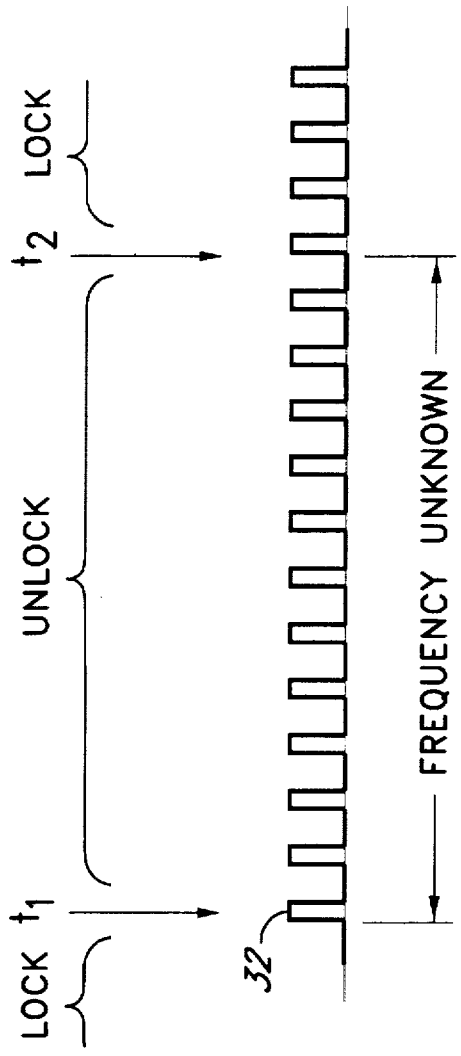
FIG. 6 (PRIOR ART)
FIG. 7A (PRIOR ART)
FIG. 7B (PRIOR ART)
FIG. 7C (PRIOR ART)

HIGH PRECISION CLOCK SIGNAL GENERATOR

FIELD OF THE INVENTION

This invention relates to a clock signal generator which provides a clock signal to an IC device to measure an electric performance of the IC device by an IC tester, and more particularly, to a high precision clock signal generator which applies a high precision clock signal to the IC device wherein the application of the clock signal to the IC device is ON/OFF controlled in a real time basis by a test program in the IC tester.

BACKGROUND OF THE INVENTION

In testing an IC device by an IC tester, a clock signal of variable timings is provided to the IC device as a test signal. The resulted signal from the IC device is compared with expected data produced by the IC tester to determine whether the IC device functions correctly or not.

Some IC devices to be tested require a high precision clock signal to be fully tested by the IC tester. For example, a clock signal in such IC devices functions as a timing reference in the various operation of the IC devices. In such a situation, before applying to the IC device (DUT), the clock signal is provided to a jitter reduction circuit to remove the jitter on the clock signal. Thus, such a jitter reduction circuit is provided between a timing generator which generates various clock signals and timing signals and the IC device to be tested to purify the clock signal. The output of the jitter reduction circuit is supplied to the IC device to be tested.

A test configuration including such a clock generator in an IC tester is shown in FIG. 5. Basic structure of FIG. 5 includes a timing generator 50, a pattern generator 60, a jitter reduction circuit 30. A clock signal generated by the timing generator 50 is provided to the clock terminal of a DUT through the jitter reduction circuit 30. The pattern generator 60 provides test patterns to other terminals of the DUT through driver circuits.

The timing generator 50 generates various timing signals, clock signals and control signals for testing IC devices. These signals are controllable by a test program prepared in an IC tester, and are provided to the pattern generator 60, the jitter reduction circuit 30, and other circuit components. The jitter reduction circuit 30 is to reduce the jitter of an incoming signal. As is well known in the art, a jitter is a short term instability in either the amplitude or phase of a signal.

Each of the timing signals, clock signals and control signals is independent from one another to form a multi-channel test paths and is generated with an arbitrary test rate. The multi-channel test paths are required for providing test signals to corresponding numbers of pins of an IC device to be tested. Further, although not shown, each circuit in the timing generator 50 for providing a clock signal to the DUT includes a delay circuit to adjust timing skew between clock signals for other pins of the DUT or another DUT.

Because of the program control, the skew control and other additional circuits, clock signals generated by the timing generator 50 tend to include more jitters than an ordinary clock signals. Therefore, for testing an IC device which is timing sensitive, the clock signal must be purified, i.e., a jitter of the clock signal must be removed or reduced before applying the clock signal to the IC device.

In receiving the timing clocks from the timing generator 50, the pattern generator 60 generates test pattern signals based on the pattern data provided in the test program with the timings determined by the timing clocks. The test pattern signals include a driver pattern which is a test pattern to be applied to the DUT through the driver circuits and an expected data pattern to be used to compare with the resulted output of the DUT by logic comparators (not shown). The test patterns are generated in a plurality of test channels so that other terminals of the DUT are provided with test patterns in a timing relative to the clock signal and the results are compared with corresponding expected data patterns produced by the pattern generator.

As noted above, the jitter reduction circuit 30 reduces jitters of the clock signal from the timing generator 50. Because of the rather complicated procedure and the circuit arrangement in the timing generator 50 as above, the clock signal 31 from the timing generator 50 tends to have a jitter as shown in FIG. 6A. Therefore, the purpose of the jitter reduction circuit 30 is to remove the jitter on the clock signal 31 to produce a clock signal 32 with higher purity as shown in FIG. 6B.

FIG. 8 shows a circuit example of the jitter reduction circuit 30 of FIG. 5. In this example, the jitter reduction circuit 30 is formed of a phase lock circuit. The phase lock circuit includes frequency dividers 34 and 35, of a dividing ratio 1/N a phase detector 36, a filter 37, a voltage controlled oscillator 38 and a buffer 39. A phase lock loop, which is a negative feedback loop, is formed by negatively feedbacking the output (clock signal 32) of the voltage controlled oscillator 38 to the phase detector 36 to control the frequency of the voltage controlled oscillator 38 with reference to the clock 31.

In this arrangement, the clock signal 31 is divided, if necessary, by the frequency divider 34 and is supplied to the phase detector 36. The output of the voltage controlled oscillator 38, which is the clock signal 32, is divided by the frequency divider 35 and is supplied to the phase detector 36. The phase detector 36 detects a phase difference between the clock signal 31 and the clock signal 32. The phase detector 36 generates a voltage representing the phase difference between the clock signal 31 and the clock signal 32 which is provided to the voltage controlled oscillator 38 through the filter 37.

As is well known in the art, the filter 37 is a low pass filter or other circuit having a first order delay so that the phase lock loop has a higher gain for a lower frequency and a lower gain for a higher frequency. The filter 37 functions as an integrator. Thus, the phase lock loop will reduce the jitter in the clock signal 32 since the phase lock loop will not respond to each jitter of the clock signal 31 but respond to an average phase difference between the clock signals 31 and 32. The clock signal 32 is supplied to the DUT through the buffer 39.

However, the clock signal generator of FIG. 5 having the jitter reduction circuit 30 between the timing generator 50 and the IC device to be tested has following problems. One of the problems is that the clock signal from the jitter reduction circuit will be undefined for a certain period after changing a frequency of the clock signal from the timing generator 50. In a function test of an IC device, it is a common test practice to change the frequency of the clock signal applied to the IC device to determine whether the IC device functions under the varieties of clock speed.

Since the phase lock loop in the jitter reduction circuit requires a response time for the feedback loop to lock-in the phase of the voltage controlled oscillator, the output frequency of the voltage controlled oscillator is not possible to immediately change the frequency but will be indeterminate during the transient (unlock) period of the phase lock loop. As a result, the test of the IC device for the transient period will not be accurately performed since the timing relationship for the IC device is unknown.

Other problem involved in the jitter reduction circuit of FIG. 8 is that the voltage controlled oscillator 38 outputs the clock signal 32 even when the clock signal 31 from the timing generator 50 is not provided to the jitter reduction circuit 30. This is because the voltage controlled oscillator 38 free runs when the feedback loop is not working. As a result, since the frequency of the clock signal 32 is indeterminable, it is not possible to accurately test the IC device under this situation.

FIG. 7 shows such a situation of transient operation in the phase lock loop of the jitter reduction circuit 30 of FIG. 8 when the reference frequency has been changed. Assuming the frequency of the clock signal 31 for the jitter reduction circuit 30 is changed at a time t1 of FIG. 7A, the phase lock loop in the jitter reduction circuit 30 is in an unlock state until a time t2. During this unlock period, the clock signal 32 of FIG. 7B and other test signal of FIG. 7C are applied to the DUT of FIG. 5. However, since the clock signal 32 is not yet phase locked during this period, there is no fixed phase or timing relationship between the clock signal and the other test signals. The frequency and phase of the clock signal 32 is not known during this transient period, thus, it is not possible to adequately test the DUT.

Further, since the number of clocks or phase difference during this unlock period are not accurately predictable, it is not possible to estimate the internal states of the DUT if the DUT is driven by the clock signals and/or test signals during this period. In testing such a type of IC device, an initializing pattern must be applied to the IC device to set the internal state of the IC device to a predetermined state every time when the clock signal has been changed. This initialization process needs additional test patterns and processing times, which lowers a test throughput or overall test efficiency.

SUMMARY OF THE INVENTION

Therefore, it is an object of the present invention to provide a clock signal generator having a jitter reduction circuit which is capable of testing an IC device when a frequency of a clock signal for the IC device is changed without initializing the internal state of the IC device.

It is another object of the present invention to provide a clock signal generator having a jitter reduction circuit which is capable of inhibiting a clock signal and other test signals from being supplied to an IC device under test for a transient period during which a clock signal frequency is changed.

It is a further object of the present invention to provide a clock signal generator having a jitter reduction circuit which is capable of controlling a time period for inhibiting a clock signal and the test signals from reaching the IC device based on a time length of phase lock loop response in the jitter reduction circuit.

It is a further object of the present invention to provide a clock signal generator which is capable of controlling a time period for inhibiting the clock signal and the test signals from reaching the IC device based on a control signal produced by a test program.

In the present invention, a clock control circuit is provided between a jitter reduction circuit and an IC device to be tested. The clock control circuit inhibits the clock signal from reaching the IC device for a time period required for a clock signal changes to a new frequency.

The clock signal generator of the present invention includes: a timing generator for generating clock signals and timing signals based on a test program, a pattern generator which receives the timing signals from the timing generator for producing test pattern signals to be supplied to the IC device based on the test program, a jitter reduction circuit for receiving a clock signal from the timing generator and for reducing a jitter of the clock signal, and a clock control circuit for inhibiting the clock signal from the jitter reduction circuit from being supplied to the IC device for a inhibit period determined by the test program when a frequency of the clock signal has been changed.

According to the present invention, the clock signal generator having the jitter reduction circuit is capable of temporarily inhibiting the clock signal from reaching the DUT during the transient period for changing a frequency of the clock signal. Such a transient period is determined by the time length required for the phase lock loop in the jitter reduction circuit to lock-in for the new frequency. Thus, it is not necessary to provide a pattern for initializing the internal state of the IC device after the frequency change of the clock signal since the internal state of the DUT will be unchanged during the transient period of the frequency change in the clock signal.

As a result, the clock signal generator of the present invention makes possible to immediately start the test of the DUT after the change of the frequency of the clock signal since the internal state of the DUT is known. Since the process of initializing the internal state of the DUT is unnecessary, a time required for such an initialization process will be saved, which makes the design of the test pattern program easy and shortens the overall test time. Therefore, the clock signal generator of the present invention improves the test efficiency and throughput of the IC tester.

BRIEF DESCRIPTION OF THE DRAWINGS

FIG. 6 is schematic diagram showing waveforms at input and outputs of a jitter reduction circuit.

FIG. 7 is a timing chart showing a clock signal and a test signal during a period for changing a frequency of the clock signal.

DETAILED DESCRIPTION OF THE PREFERRED EMBODIMENT

Figure 1:
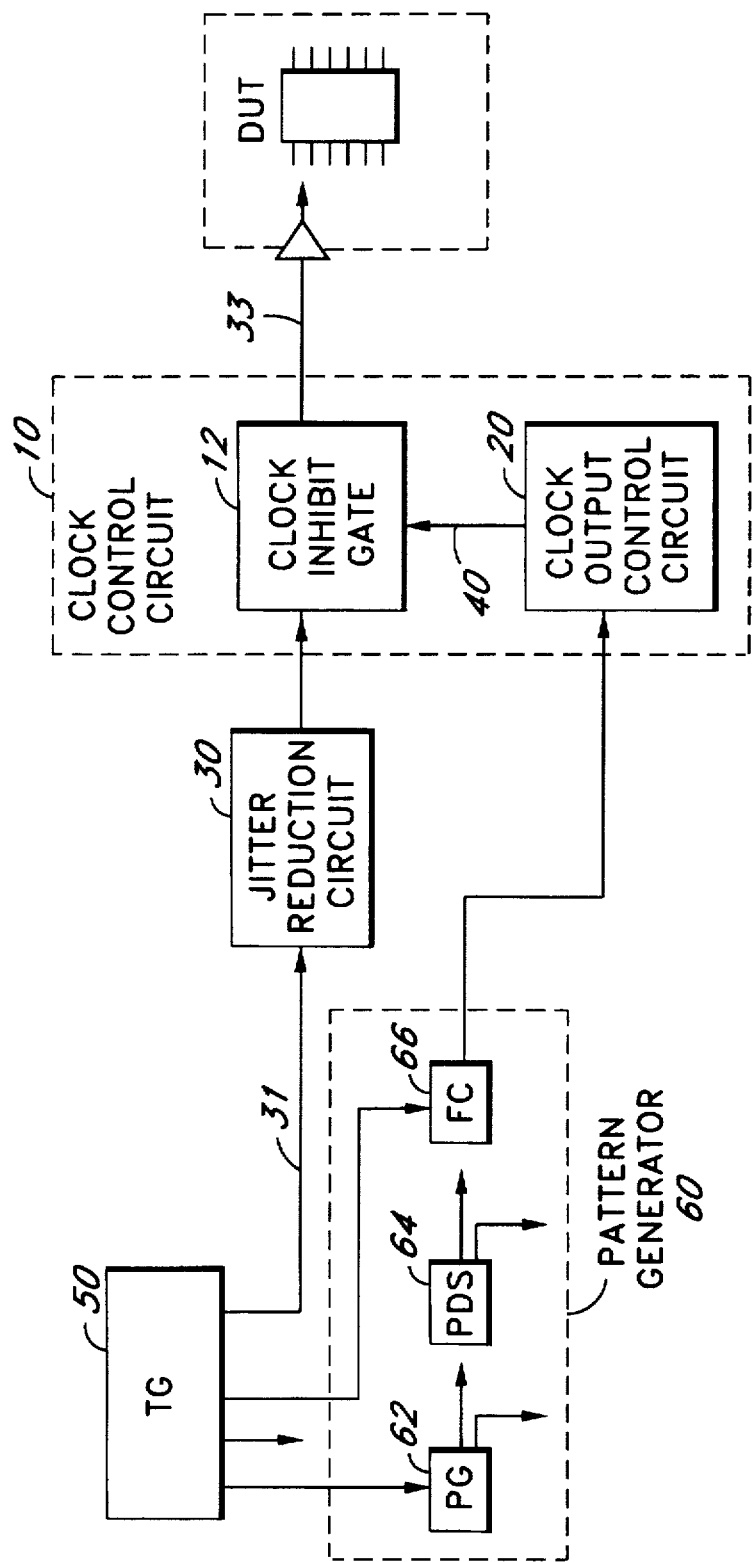
FIG. 1 is a schematic diagram showing a test structure associated with a clock signal generator of the present invention which has a clock control circuit after a jitter reduction circuit.
Figure 5:
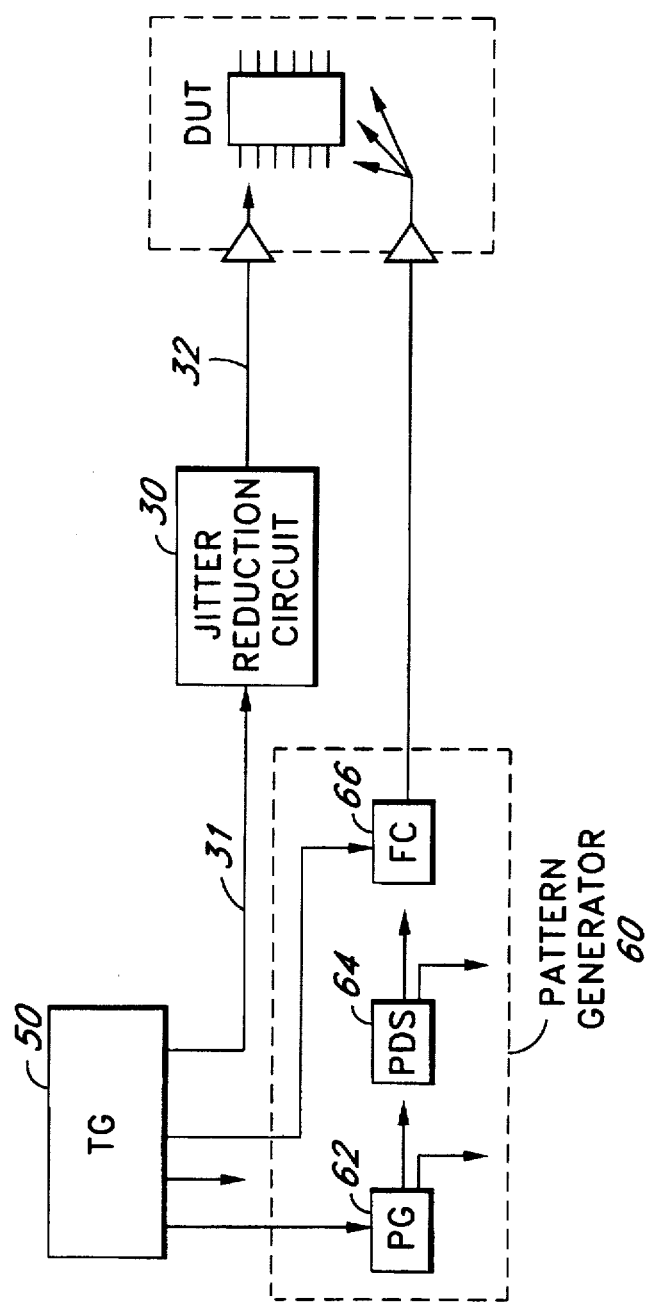
FIG. 5 is a schematic diagram showing a test structure having a conventional clock signal generator having a jitter reduction circuit.
Figure 8:
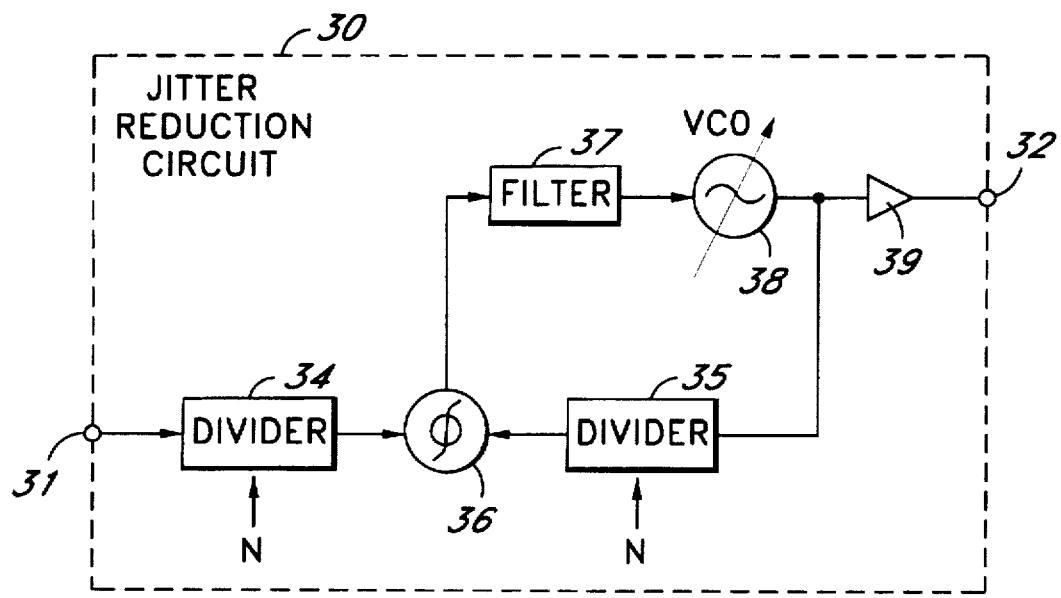
FIG. 8 is a circuit diagram of a jitter reduction circuit to be used in a clock signal generator.

FIG. 1 shows a clock signal generator of the present invention in which the same reference numerals as used in FIG. 5 designate the corresponding parts of the clock generator. Thus, the clock signal generator of the present invention includes a timing generator 50, a pattern generator 60, a jitter reduction circuit 30 and a clock control circuit 10. The clock control circuit 10 is provided between the jitter reduction circuit 30 and the IC device to be tested (DUT).

The clock control circuit 10 is formed of a clock inhibit gate 12 and a clock output control circuit 20. The clock inhibit gate 12 inhibits the clock signal 32 from reaching the DUT for a period determined by a clock inhibit signal 40 from the clock output control circuit 21. The length of the clock inhibit signal 40 is designed to cover the time period required for the phase lock loop in the jitter reduction circuit 30 to come to the phase lock (lock-in) after the input frequency has been changed.

Figure 2:
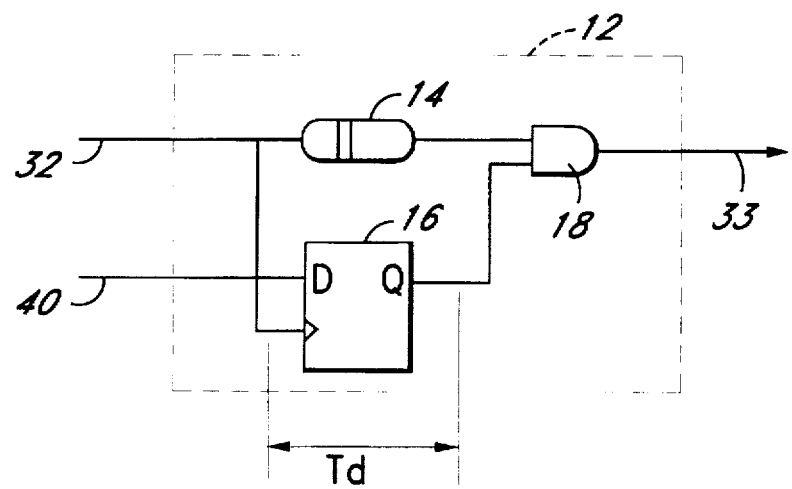
FIG. 2 is a circuit diagram showing an example of clock inhibit gate used in the clock control circuit of FIG. 1.

FIG. 2 shows a circuit example of the clock inhibit gate 12. In this example, the clock inhibit gate 12 includes a delay element 14, a flip-flop 16 and an AND gate 18. The clock inhibit gate 12 inhibits the clock signal 32 at a timing synchronized with the clock signal 32. The flip-flop 16 receives a clock inhibit signal 40 from the clock output control circuit 20 and adjust the timing of the clock inhibit signal 40 with the clock signal 32.

Figure 9:
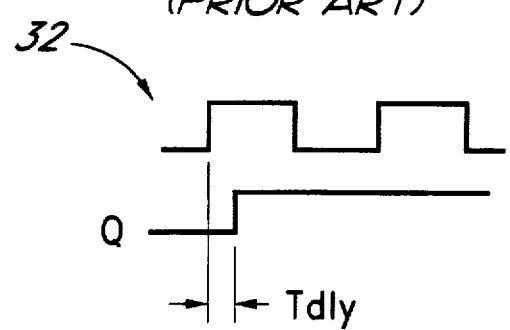
FIG. 9 is schematic diagram showing a propagation delay time of a flip-flop used in the clock inhibit gate 12 of FIG. 3.

The output of the flip-flop 16 is provided to an input of the AND gate 18 whose another input is connected to the delay element 14. The output of the flip-flop 16 is delayed by a propagation delay Td of the flip-flop 16 from the clock signal 32 as shown in FIG. 9. The delay time of the delay element 14 is selected to be a slightly longer than the propagation delay time Td of the flip-flop 16 to ensure that the clock signal 32 is inhibited by the output of the flip-flop 16 at the AND gate 18. Under this arrangement, application of a clock signal 33 at the output of the clock control circuit 10 to the DUT is controlled to be either enabled or disabled by the clock inhibit signal 40 from the clock output control circuit 20.

Figure 3:
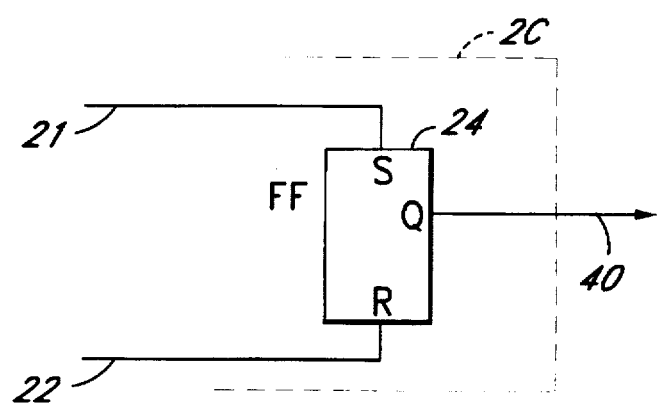
FIG. 3 is a circuit diagram showing an example of clock output control circuit used in the clock control circuit of FIG. 1.

FIG. 3 shows a circuit example of the clock output control circuit 20 of the present invention in which an RS flip-flop 24 is used to generate the clock inhibit signal 40. The clock inhibit signal 40 is generated by setting the RS flip-flop 24 by a start signal 21 and resetting the RS flip-flop 24 by a stop signal 22. As noted above, the clock inhibit signal 40 is supplied to the clock inhibit gate 12. The start signal 21 and the stop signal 22 are pulse signals which can be freely generated by a test program with arbitrary timings when a frequency of the clock signal has to be changed.

For example, the start signal 21 and stop signal 22 can be generated by providing a program description in the DUT test pattern with reference to a signal from the pattern generator 60 or a signal from the timing generator 50. Also by the test program, the test pattern signals for other terminals of the DUT are designed to be inhibited during the period between the stop signal 22 and the start signal 21 in concert with the prohibition of the clock signal.

Figure 4:
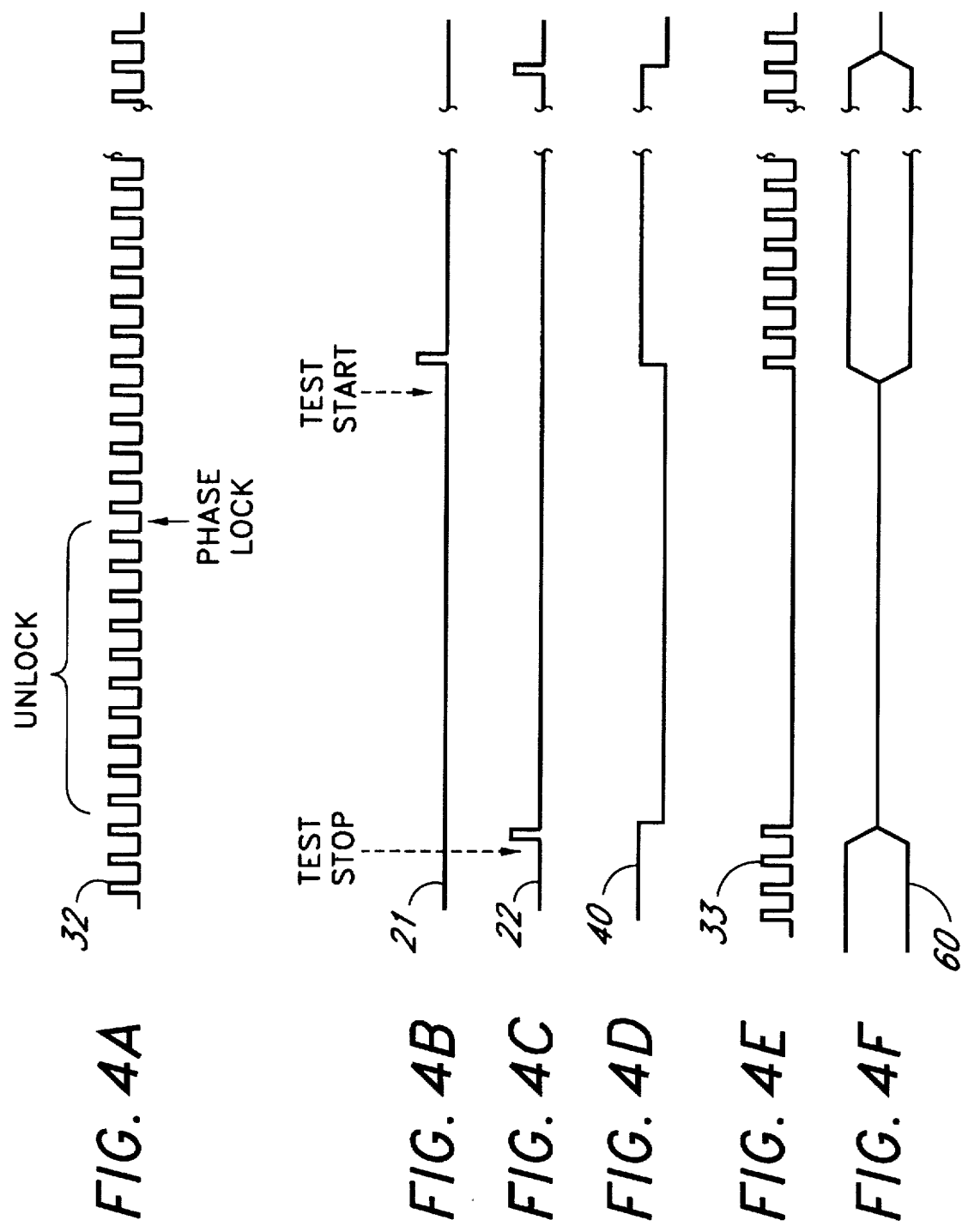
FIG. 4 is a timing chart for explaining the operation of the clock signal generator of the present invention.

FIG. 4 is a timing chart showing the operation of the clock signal generator of the present invention. The clock signal 32 of FIG. 4A from the jitter reduction circuit 30 is frequency changed when the clock signal 31 from the timing generator 50 is changed in response to the operation of the phase lock loop. As noted above, since the phase lock loop needs a certain time period for the phase lock operation is completed for the new frequency, the frequency of the clock signal 32 is indeterminable for the unlock period of FIG. 4A before reaching the phase lock.

Immediately prior to the frequency change of the clock signal 31, the stop signal 22 of FIG. 4C is generated so that the clock inhibit signal 40 of FIG. 4D is provided to the clock inhibit gate 12. The clock signal 32 is inhibited by the clock inhibit gate 12 in synchronism with the clock signal 32. As a consequence, the clock signal 33 is not generated at the output of the clock control circuit 10 as shown in FIG. 4E and thus not provided to the DUT. Test pattern signals of FIG. 4F for other terminals of the DUT are also temporarily prohibited from being applied to the DUT based on the test program.

By the elapse of the response time of the phase lock loop in the jitter reduction circuit 30, the clock signal 32 is in the phase lock state as shown in FIG. 4A. After accomplishing the phase lock, the start signal 21 of FIG. 4B resets the clock inhibit signal 40 of FIG. 4D so that the inhibit gate 12 allows the clock signal 32 to pass through. Thus, the clock signal 33 of FIG. 4E is produced at the output of the clock control circuit 10. At the same time, the test pattern signal of FIG. 4F is also allowed to be applied to the DUT.

As in the foregoing, the clock signal 33 from the clock control circuit 10 and the other test pattern signal 60 are applied to the DUT in synchronism with each other after the clock inhibit period. The clock signal 33 when applied to the DUT is phase locked with the clock signal 31 from the timing generator and no unknown frequency clock signal is applied to the DUT during the transient period of the phase lock loop. Thus, the internal state of the DUT will not change during the transient period of the phase lock loop since neither the clock signal nor the test pattern is applied to the DUT.

Since the internal state of the DUT is known in the present invention when changing the frequency of the clock signal, it is not necessary to provide a pattern to the DUT for initializing the internal state of the DUT. Such a process of initializing the internal state of the DUT is necessary in the conventional technology every time when the clock signal frequency has to be changed. Thus, in the present invention, since the time for applying the initialization pattern is unnecessary, it is possible to improve an overall test efficiency or test throughput.

In the above example, the clock inhibit gate 12 includes the delay element 14 and the flip-flop 16 in FIG. 2. However, a person having an ordinary skill in the art can use other circuit arrangements within the inventive features of the present invention. Further, in the above example, to generate the clock inhibit signal 10, the clock output control circuit 20 is provided with the start signal 21 and the stop signal 22 from the pattern generator 60. However, it is also possible to generate the clock inhibit signal 10 directly from the timing generator 50 or the pattern generator 60 according to the test program.

As has been in the foregoing, according to the present invention, the clock signal generator having the jitter reduction circuit is capable of temporarily inhibiting the clock signal from reaching the DUT during the transient period for changing a frequency of the clock signal. Such a transient period is determined by the time length required for the phase lock loop in the jitter reduction circuit to lock-in for the new frequency. Thus, it is not necessary to provide a pattern for initializing the internal state of the IC device after the frequency change of the clock signal since the internal state of the DUT will be unchanged during the transient period of the frequency change in the clock signal.

As a result, the clock signal generator of the present invention makes possible to immediately start the test of the DUT after the change of the frequency of the clock signal since the internal state of the DUT is known. Since the process of initializing the internal state of the DUT is unnecessary, time required for such an initialization process will be saved, which makes the design of the test pattern program easy and shortens the overall test time. Therefore, the clock signal generator of the present invention improves the test efficiency and throughput of the IC tester.

What is claimed is:

1. A clock signal generator to be used in an IC tester for providing a clock signal to an IC device to be tested, comprising:

a timing generator for generating clock signals and timing signals based on a test program which is a set of instructions stored in said IC tester for performing test operations;

a pattern generator connected to said timing generator to receive said timing signals for producing test pattern signals to be supplied to said IC device based on said test program;

a jitter reduction circuit for receiving said clock signal from said timing generator and reducing a jitter of said clock signal, said jitter reduction circuit being formed with a phase lock loop having a voltage controlled oscillator, a phase comparator and a filter to phase lock an oscillation frequency of said voltage controlled oscillator with a frequency of said clock signal; and a clock control circuit for inhibiting said clock signal from said jitter reduction circuit from being supplied to said IC device for a inhibit period determined by said test program when a frequency of said clock signal has been changed, said inhibit period being determined on the basis of a time length required for said phase lock loop to lock-in for said clock signal that has been changed.

2. A clock signal generator as defined in claim 1, wherein said clock control circuit is formed of a clock inhibit gate which inhibits said clock signal from said jitter reduction circuit from reaching said IC device for said inhibit period, and a clock output control circuit which provides a clock inhibit signal during said clock inhibit period to said clock inhibit gate.

3. A clock signal generator as defined in claim 2, wherein said clock inhibit signal is produced by a stop signal and a start signal from said pattern generator generated based on said instructions in said test program.

4. A clock signal generator as defined in claim 2, wherein said clock inhibit period for said clock inhibit gate is produced by a stop and start command from said pattern generator generated based on said instructions in said test program.

5. A clock signal generator as defined in claim 1, wherein said control circuit inhibits said clock signal from said jitter reduction circuit for said inhibit period which is longer than a transient time required for said phase lock loop in said jitter reduction circuit attaining a phase lock state when said frequency from said timing generator has been changed.

6. A clock signal generator as defined in claim 2, wherein said clock inhibit gate includes a flip-flop which is triggered by said clock signal from said jitter circuit and a delay element having a delay time longer than a propagation delay time of said flip-flop.

7. A clock signal generator as defined in claim 2, wherein said clock output control circuit is formed of an RS flip-flop which is driven by a start signal and a stop signal from said pattern generator generated based on said instructions in said test program to produce said clock inhibit signal which is supplied to said clock inhibit gate.

* * * * *